United States Patent [19]

Cutchaw

[11] 3,997,227

[45] Dec. 14, 1976

[54] CONNECTOR AND HANDLING DEVICE FOR MULTILEAD ELECTRONIC PACKAGES

[76] Inventor: John M. Cutchaw, 7333 E. Virginia, Scottsdale, Ariz. 85257

[22] Filed: July 28, 1975

[21] Appl. No.: 599,893

[52] U.S. Cl. .................. 339/17 CF; 339/75 MP
[51] Int. Cl.² ...................................... H01R 13/54
[58] Field of Search ...... 339/17 C, 17 CF, 176 MP; 336/75 MP

[56] References Cited
UNITED STATES PATENTS

| | | | |
|---|---|---|---|
| 3,622,950 | 11/1971 | Millinger | 339/17 CF X |
| 3,660,799 | 5/1972 | Tinkelenberg et al. | 339/17 CF X |
| 3,665,370 | 5/1972 | Hartmann | 339/75 MP |
| 3,697,929 | 10/1972 | Konewko et al. | 339/176 MP X |
| 3,825,876 | 7/1974 | Damon et al. | 339/17 CF |
| 3,848,221 | 11/1974 | Lee | 339/176 MP X |

OTHER PUBLICATIONS

Abbatecola; "Force-free Insertion and Removal of Circuit Cards"; IBM Tech. Disclosure Bulletin vol. 9, No. 2, July 1966, pp. 142 & 143.

Primary Examiner—Joseph H. McGlynn
Assistant Examiner—Craig R. Feinberg
Attorney, Agent, or Firm—Herbert E. Haynes, Jr.

[57] ABSTRACT

A device which facilitates the handling, storage and shipment of a multilead integrated electronic package and provides a demountable solderless connector for attaching the package to a wiring panel.

6 Claims, 7 Drawing Figures

U.S. Patent    Dec. 14, 1976    3,997,227
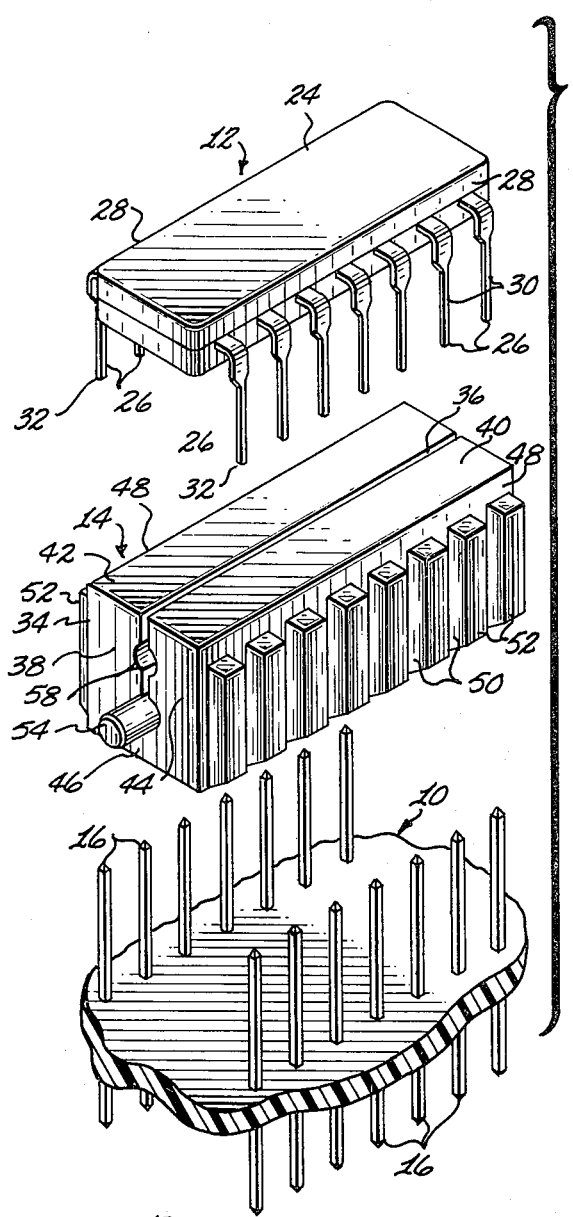
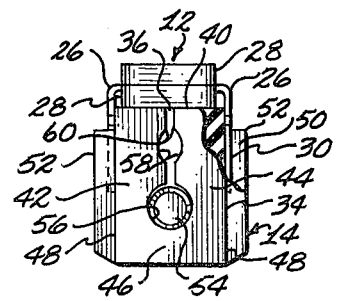
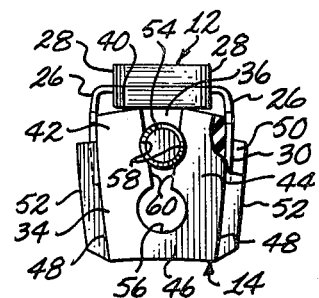
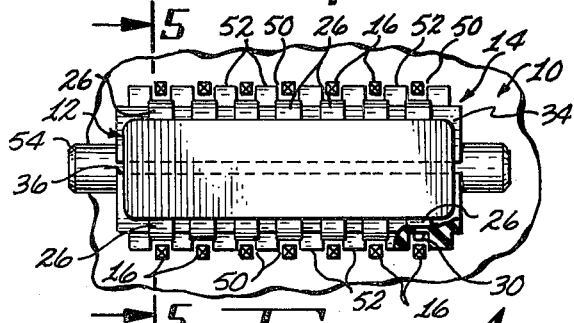
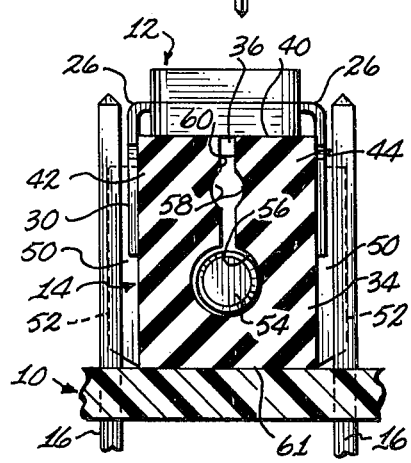
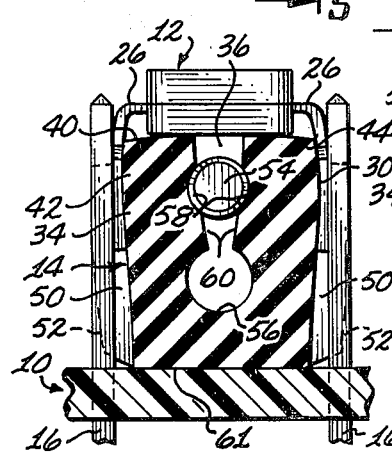
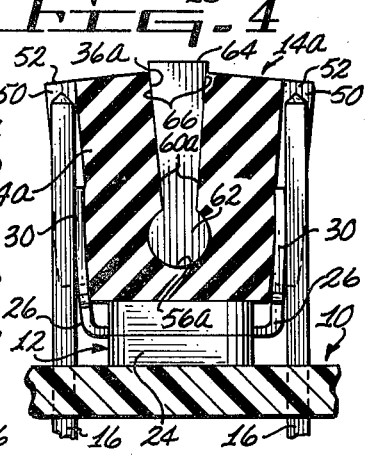

CONNECTOR AND HANDLING DEVICE FOR MULTILEAD ELECTRONIC PACKAGES

BACKGROUND OF THE INVENTION

1. Field of the Invention

This invention relates to connectors and more particularly to a connector and handling device for miniaturized multilead integrated electronic circuits.

2. Description of the Prior Art

The advantages of miniaturized multilead integrated electronic circuit packages are well known in the electronic arts, and the problems of handling, storage, shipment, assembly, disassembly and the like are also well known. Those problems are particularly troublesome in regard to the type of multilead integrated circuit known as a dual-in-line package, hereinafter referred to as a "DIP".

The dual-in-line package, or DIP, is an extremely small structure having a plurality of metallic conductive buses or leads extending from opposite longitudinal sides thereof. The leads extend a relativey short distance from the DIP body and are bent at approximately 90° so as to depend therefrom in two longitudinally extending aligned rows. The leads of the DIP are relatively thin and flexible and therefore cannot withstand rough handling such as may occur during storage, shipping, circuit fabrication, assembly and the like.

The DIP is usually assembled to a wiring panel by inserting the aligned leads thereof into special apertures formed in the panel and soldering the leads therein. It is well known that the solder type of connection is highly desirable due to its inherent gastight connection. The desirable feature of a gastight connection is that no air or moisture can enter the pores or irregularities in the metal to cause corrosion which would decrease signal strength due to increased impedance of the connection.

The dense packaging arrays in common usage in modern electronic equipment have increased the cost of individual wiring panels to the point that stockpiling a spare of each type of such panels at an equipment installation is very expensive. It is, therefore, a common practice to repair the wiring panels at the installation whenever possible. In the process of troubleshooting a wiring panel, it is often necessary to resort to the substitution method; that is, removal and replacement of one or more elements until the problem has been corrected. The above described solder connection of the DIP to the wiring panel has made removal and replacement of the DIP's extremely hazardous as many costly elements and wiring panels have been destroyed by the application of excessive heat.

Many devices have been devised in attempts to circumvent the problems associated with the solder interconnection of a DIP with a wiring panel or board. Such prior art connectors generally employ an insulative body having a plurality of apertures formed therein in aligned rows to receive the leads of the DIP simultaneously with wire wrapping pins provided on the wiring panel. Each of the apertures contain a spring contact or some other means for deflecting the leads of the DIP into conductive contact with their respectively juxtaposed wire wrapping pins. Such connectors have not been commercially accepted to any great extent in that they cannot compete with the solder type of connection from the standpoint of cost, simplicity and reliability. Further, most of these prior art connectors are used solely as connectors and make no provisions for handling, storage and shipment of the DIPS.

Therefore, a need exists for a new and improved solderless connector for mounting DIPS to a wiring panel which overcomes some of the problems of the prior art structures and further provides means for facilitating handling, shipment, and storage of the DIPS.

SUMMARY OF THE INVENTION

In accordance with the present invention, a new and improved connector is disclosed for electrically interconnecting the leads of a DIP with the aligned wire wrapping pins of a wiring panel in a demountable solderless manner with the connector also providing for the safe and damage free shipment, storage and handling of the DIP. The connector includes an electrically insulative body sized to fit between the pair of aligned rows of the leads of the DIP. The insulative body is fabricated of a resilient material and is provided with means for lateral expansion thereof so that when the DIP is positioned to straddle the connector body, lateral expansion of that body will move it into gripping engagement with the leads of the DIP. In this manner, the DIP is supportingly affixed to the connector body and the DIP is thereby protected from normal types of damage to the leads thereof such as may occur during shipping, storage, and other handling.

This same laterally expansive feature of the connector body is employed to mechanically mount and electrically interconnect the DIP on a wiring panel. This is accomplished by aligningly positioning the connector body, having the DIP mounted thereon, between a pair of spaced aligned rows of wire wrapping pins provided on the wiring panel and laterally expanding the connector so as to deflect the rows of leads of the DIP in opposite directions to mechanically pressure each of the leads into electrically conductive contact with a different one of the wire wrapping pins of the wiring panel.

Accordingly, it is an object of the present invention to provide a new and improved connector and handling device for multilead integrated circuit packages.

Another object of the present invention is to provide a new and improved connector and handling device for multilead integrated circuit packages which may be employed for solderless demountable connection of the multilead integrated circuit package on a wiring panel.

Another object of the present invention is to provide a new and improved connector and handling device which mechanically pressurizes the leads of a multilead integrated circuit package into electrically conductive contact with juxtaposed wire wrapping pins provided on a wiring panel.

A still further object of the present invention is to provide a new and improved connector and handling device of the above described character upon which the multilead integrated circuit package may be supportingly affixed for protection against lead damage thereof.

The foregoing and other objects of this invention, the various features thereof as well as the invention itself, may be more fully understood from the following description when read in conjunction with the accompanying drawing.

BRIEF DESCRIPTION OF THE DRAWING

FIG. 1 is an isometric view of a fragmentary portion of a wiring panel having the connector and integrated circuit package exploded therefrom.

FIG. 2 is an end view of the connector and handling device of the present invention having the integrated circuit package positioned thereon and having the device partly broken away to show the various features thereof.

FIG. 3 is an end view similar to FIG. 2 and showing the connector and handling device as having been laterally expanded to grippingly affix the integrated circuit package thereto.

FIG. 4 is a plan view of the connector and handling device of the present invention having the integrated circuit package positioned thereon and disposed between a pair of rows of aligned wire wrapping pins of a wiring panel.

FIG. 5 is an enlarged sectional view taken on the line 5—5 of FIG. 4.

FIG. 6 is a sectional view similar to FIG. 5 and showing the connector and handling device of the present invention as having been laterally expanded to mechanically pressure the leads of the integrated circuit package into conductive contact with the pins of the wiring panel.

FIG. 7 is a sectional view similar to FIG. 6 and illustrating a modified form of the connector and handling device of the present invention.

DESCRIPTION OF THE PREFERRED EMBODIMENTS

Referring more particularly to the drawings, FIG. 1 is an isometric view of a fragmentary portion of a type of wiring panel 10, with a DIP integrated circuit 12, and a connector or handling device 14 exploded therefrom. The wiring panel 10 utilizes standard wire-wrap pins 16 arranged in two substantially parallel rows, and the wire-wrap pins 16 are inserted in the wiring panel in accordance with techniques well known in the art. It should be noted that the particular type of wiring panel 10 shown is only for illustration purposes as other types of well known panels would work equally as well with the connector of the present invention.

The standard DIP integrated circuit 12 comprises a housing 24 which contains miniaturized circuitry (not shown). Electrical contact with the internal miniaturized circuitry is made through a plurality of planar leads 26 which extend laterally from opposite longitudinal sides 28 of the housing 24. The leads 26 extend from their respective sides 28 of the housing 24 a short distance and are bent into an approximate right angle so as to depend from the housing 24 in a pair of substantially parallel spaced rows 32. As is customary, the leads 26 of the DIP 12 each have a reduced dimension portion which serves as a contact area 30 as will become apparent as this description progresses.

The connector and handling device 14 of the present invention comprises a body 34 having a slot 36 formed therein so as to extend longitudinally thereof. The slot 36 opens at each of the opposite ends 38 of the body 34 and also opens along one of the longitudinal surfaces 40 thereof. The slot 36 is disposed so as to divide the block in two substantially equal longitudinal sides or segments 42 and 44 which are interconnected integrally by an interconnecting segment 46 disposed oppositely from the surface 40 of the body 34. Thus, the longitudinal segments 42 and 44 may be considered as interconnected flap like members, and those segments 42 and 44 are adapted to be laterally and oppositely deflected as will hereinafter be described in detail.

The outwardly facing surface 48 of each of the longitudinal segments 42 and 44 is configured in an alternating series of grooves 50 and lands 52 which are disposed transverse with respect to the longitudinal dimension of their respective segments 42 an 44. The spaced relationship of the grooves 50 and lands 52 are such that when the DIP 12 is positioned on surface 40 of the connector body 34, the leads 26 of the DIP 12 will each extend into a different one of the grooves 50 and a different one of the lands 52 will laterally protrude between each adjacent pair of the leads 26. This arrangement is designed for positive placement of each of the leads 26 of the DIP and to insure against bending or other damage thereof.

The connector body 34 may be formed as by casting, molding or other suitable method from any suitable resilient dielectric material, materials which are elastomeric such as neoprene or rubber are preferred. However, other materials having the hereinbefore described characteristic of resiliency and are electrically insulative may be employed such as those materials generally falling into the classes of thermosetting or thermoplastic resilient synthetic materials.

As hereinbefore mentioned, the flap like longitudinal segments 42 and 44 of the connector body 34 are adapted to be laterally and oppositely deflected so that the connector body 34 may be considered as laterally expandable. This lateral expansion is accomplished by a special configuration formed within the slot 36 of the connector body 34 which cooperates with a laterally expanding means which in the preferred embodiment is in the form of a cylindrical rod 54. As shown in FIGS. 1–6, the slot 36 extends from its opening, formed in the surface 40, inwardly into the connector body 34 and terminates in a cylindrical chamber 56 which extends longitudinally of the body 34 and is open at its opposite ends. A longitudinally extending notch or detent 58 is formed in each of the surfaces 60 of the slot 36 with those notches 58 being arcuate in cross section, disposed to face each other and positioned intermediate the chamber 56 and open top of the slot. The laterally expanding means in the form of rod 54 is positioned within the slot 36 of the connector body 34 so that its opposite ends extend beyond the opposite ends 38 of the connector body 34, and the rod 54 is movable between the chamber 56 and the notches 58 of the slot. It will be noted that in the relaxed, i.e., not laterally expanded, state of the connector body 34, the open area circumscribed by the notches 58 is considerably less than the open area of the chamber 56 so that when the rod 54 is in the chamber 56 the connector body 34 is in its relaxed state, and when the rod 54 is moved into the chamber circumscribed by the notches 58 the connector body will be in its laterally expanded state.

Reference is now made to FIGS. 2 and 3 wherein the connector and handling device 14 is shown as being employed as a handling device. The DIP integrated circuit 12 is supportingly positioned on surface 40 of the connector body 34 so that each of the leads 26 extend into a different one of the grooves 50 as hereinbefore described. In FIG. 2, this straddling positioning of the DIP 12 is shown with the connector 14 in the relaxed state. Movement of the rod 54 from its first position within the chamber 56 to its second position of engagement between the notches 58 will laterally and oppositely deflect the longitudinal segments 42 and 44 of the body 34 into gripping engagement with the leads 26 of the DIP 12 as shown in FIG. 3. Thus, the DIP 12 is supportingly affixed to the connector body 34 and is thereby protected from normal types of lead damage which could otherwise occur during normal handling theroef.

As best seen in FIG. 4, the two rows of wire-wrap pins 16 of the wiring panel 10 are spaced apart a distance somewhat greater than the relaxed state width dimension of the connector 14 so that the connector, having the DIP 12 mounted thereon, can be positioned between the rows of pins 16. It may also be seen that the pins 16 are spaced from each other so that each of the pins 16 may be aligned with a different one of the grooves 50 of the body 34. Thus, the connector 14 in its relaxed state and having the DIP 12 straddingly mounted thereon may be positioned between the rows of pins 16 with zero insertion force and the contact position 30 of each lead 26 of the DIP 12 will automatically align with a different one of the pins 16 in a juxtaposed spaced relationship. The automatic alignment of the leads 26 and the pins 16 is accomplished by the lands 52 of the body 34 which protrude therefrom into the spaces between the pins 16.

FIG. 5 best illustrates the relaxed state of the connector 14 having the DIP 12 mounted thereon and nestingly positioned between the spaced rows of pins 16 of the wiring panel 10. As hereinbefore described, when the rod 54 is moved from the chamber 56 into engagement with the notches 58, the longitudinal segments 42 and 44 will be oppositely and laterally deflected, and as shown in FIG. 6, that deflection will move the contact portion 30 of each of the leads 26 into contiguous engagement with their respectively aligned pins 16. Such deflection requires that a substantial amount of force be exerted due to the resistance provided by the pins 16, and that force mechanically pressures the leads 26 into electrically conductive contact with the pins 16. Due to the amount of force required, the pins 16 will be deflected somewhat and the longitudinal segments 42 and 44 will be distorted. The natural resiliency of both the pins 16 and the segments 42 and 44 will aid in maintaining a gastight connection between the leads 26 and the pins 16. It should further be noted that the above described forces and resulting deflections will cause a wiping action to occur between the mating surfaces of the leads 26 and the pins 16 when the connections therebetween are being made. This wiping action will clean the contacting surfaces of the leads 26 and pins 16 and will reduce surface irregularities thereof so that a gastight connection therebetween is formed over a substantial length of the leads and pins.

A suitable adhesive (not shown) may be applied to the surface 61 of the connector body 34 so that when the connector 14 is positioned as shown in FIGS. 5 and 6 the connector will be fixed to the surface of the wiring panel 10.

Reference is now made to FIG. 7 wherein a modified form of the connector of the present invention is shown as being employed to connect the DIP 12 to the wiring panel 10 in an inverted position. This type of inverted mounting of the DIP 12 is sometimes referred to as the "dead bug" mounting technique due to the rows of leads 26 extending upwardly from the housing 24 rather than depending therefrom. The connector 14a of this configuration or embodiment is essentially the same as the hereinbefore described connector 14 with the exception of the slot configuration and the configuration of the laterally expanding means. In this embodiment, the slot 36a is provided with the longitudinally extending chamber 56a only, and the laterally extending means is formed with a longitudinally extending cylindrical rod like enlargement 62 having a wedge shaped member 64 integral therewith and radially therefrom. In the relaxed state of the connector 14a the laterally extending means is completely removed from the slot 36a and to laterally extend the connector 14a, the extending means is inserted into the slot 36a and pushed until the enlargement 62 snaps into the chamber 56a of the body 34a. The opposite side surfaces 66 of the wedge shaped member 64 bear against the surfaces 60a of the slot 36a and thus provide the needed lateral deflection.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A device for supportingly carrying an integrated circuit, said integrated circuit having a plurality of leads arranged in a spaced pair of parallel rows, said device comprising:

a. an elongated laterally expandable body of resilient material and having an opposed pair of oppositely facing longitudinal side surfaces, said body positionable between the rows of leads of the integrated circuit with each of the longitudinal side surfaces of said body positioned in inwardly disposed juxtaposed relationship to a different one of the parallel rows of leads of the integrated circuit;

b. means in said body for laterally expanding said body to move the longitudinal side surfaces thereof into gripping engagement with their respective ones of the rows of leads of the integrated circuit when said body is positioned therebetween; and c. said body having a longitudinal slot formed therein to provide said body with a pair of longitudinal segments each having one of the longitudinal side surfaces of said body thereon, the slot in said body being configured to provide a first longitudinal chamber through said body and a second reduced area longitudinal chamber through said body with said means for laterally expanding said body being movable therebetween for laterally oppositely moving said pair of longitudinal segments upon movement of said means from said first longitudinal chamber to said second reduced area longitudinal chamber of said body.

2. A device as claimed in claim 1 wherein said means for laterally expanding said body comprises an elongated cylindrical rod.

3. A device as claimed in claim 1 wherein each of the oppositely facing longitudinal side surfaces of said body is formed with an alternating series of grooves and lands therein with those grooves and lands being transverse with respect to the longitudinal dimension of their respective longitudinal side surfaces, each of the grooves formed in the side surfaces of said body being disposed to receive a different one of the leads of the integrated circuit when said body is positioned between the rows of leads of the integrated circuit.

4. A connector for removably mounting an integrated circuit on a wiring panel, said integrated circuit having a plurality of leads arranged in a spaced pair of parallel rows, said wiring panel having a plurality of pins arranged so that each of those pins is outwardly aligningly positionable adjacent a different one of the leads of said integrated circuit, said connector comprising:
   a. an elongated laterally expandable body of resilient dielectric material, said body positionable between the rows of leads of the integrated circuit;
   b. means in said body for laterally and oppositely expanding said body into deflecting engagement with the rows of leads of the integrated circuit when said body is positioned therebetween whereby the leads of the integrated circuit are mechanically pressurized into electrically conductive contact with the pins of the wiring panel when those pins are outwardly aligningly positioned adjacent the leads of the integrated circuit; and
   c. said body having a longitudinal slot formed therein to provide said body with a pair of lonitudinal segments, the slot in said body being configured to provide a first longitudinal chamber through said body and a second reduced area longitutinal chamber through said body with said means for laterally expanding said body being movable therebetween for laterally oppositely moving said pair of longitudinal segments upon movement of said means from said first longitudinal chamber to said second reduced area longitudinal chamber of said body.

5. A connector as claimed in claim 4 wherein said means for laterally expanding said body comprises an elongated cylindrical rod.

6. A connector as claimed in claim 4 wherein said body is formed with an alternating series of grooves and lands on each of a pair of the opposite longitudinal surfaces thereof with those grooves and lands being transverse with respect to the longitudinal dimension of their respective longitudinal surfaces, each of the grooves formed in said body being disposed to receive a different one of the leads of the integrated circuit when said body is positioned between the rows of leads of the integrated circuit.

* * * * *